(12) United States Patent
Chung et al.

(10) Patent No.: US 6,577,536 B1
(45) Date of Patent: Jun. 10, 2003

(54) FLAT-CELL NONVOLATILE SEMICONDUCTOR MEMORY

(75) Inventors: Cheng-Lin Chung, Jubei (TW); Lai-Ching Lin, Fengshan (TW); Nien-Chao Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/086,379

(22) Filed: Mar. 4, 2002

(51) Int. Cl.$^7$ .............................................. G11C 16/04
(52) U.S. Cl. ................................................. 365/185.11
(58) Field of Search ........................ 365/185.05, 185.11, 365/94, 103, 104

(56) References Cited

U.S. PATENT DOCUMENTS

| | | | | |
|---|---|---|---|---|
| 5,117,389 A | * | 5/1992 | Yiu ............................. | 365/104 |
| 5,966,327 A | * | 10/1999 | Jo ........................... | 365/185.11 |
| 6,084,794 A | * | 7/2000 | Lu et al. ..................... | 365/104 |
| 6,157,580 A | * | 12/2000 | Kohno ................... | 365/185.11 |
| 6,278,649 B1 | * | 8/2001 | Lee et al. ................... | 365/104 |
| 6,430,079 B1 | * | 8/2002 | Shiau .......................... | 365/104 |

* cited by examiner

Primary Examiner—Trong Phan
(74) Attorney, Agent, or Firm—Rabin & Berdo, P.C.

(57) ABSTRACT

A flat-cell nonvolatile semiconductor memory. The semiconductor memory includes a plurality of units. Each unit includes word lines, a main bit line, a ground line, sub-bit lines, memory cell columns, and bank-selecting switches. Word lines are disposed in parallel, and the main bit line and the ground line cross the word lines. Sub-bit lines are disposed substantially in parallel to the main bit lines. Each memory cell column includes a plurality of memory cells connected in parallel between respective adjacent two of the sub-bit lines. The bank-selecting switches are used to select one of the memory cell columns. The first one of the bank-selecting switches is disposed between the main bit line and the fourth sub-bit line. The second of the bank-selecting switches is disposed between the main bit line and the second sub-bit line. The third of the bank-selecting switches is disposed between the ground line and the fifth sub-bit line. The fourth of the bank-selecting switches is disposed between the ground line and the third sub-bit line. The fifth of the bank-selecting switch is disposed between the ground line and the third sub-bit line. The sixth bank-selecting switch is disposed between the ground line and the first sub-bit line. Wherein, the second, third, and fourth bank-selecting switches are controlled by a first selecting signal, and the first, fifth, and sixth bank-selecting switches are controlled by a second selecting signal.

8 Claims, 6 Drawing Sheets

| Memory Cell | Selecting Signal | Sense | Ground |
|---|---|---|---|
| M(1,j) | BS0 | BL0 | GL0 |
| M(2,j) | BS1 | BL0 | GL0 |
| M(3,j) | BS1 | BL0 | GL1 |
| M(4,j) | BS0 | BL1 | GL0 |
| M(5,j) | BS0 | BL1 | GL1 |
| M(6,j) | BS1 | BL1 | GL1 |
| M(7,j) | BS1 | BL1 | GL2 |
| M(8,j) | BS0 | BL2 | GL1 |

US 6,577,536 B1

FLAT-CELL NONVOLATILE SEMICONDUCTOR MEMORY

This application incorporates by reference Taiwanese application Serial No. 90129597, Filed Nov. 29, 2001.

BACKGROUND OF THE INVENTION

1. Field of the Invention

The invention relates in general to the semiconductor memory, and more particularly to the flat-cell nonvolatile semiconductor memory.

2. Description of the Related Art

The need for larger capacity of the nonvolatile semiconductor memory grows rapidly, and thus a high-density semiconductor memory is required. Flat-cell semiconductor memory is the one that can achieve high density and can be also easily manufactured.

FIG. 1A is a circuit diagram of the Nth bank of the read only semiconductor memory from U.S. Pat. No. 5,117,389. The memory includes some banks, and uses bank-selecting switches for selecting one of the banks. Each bank includes a memory cell array, and each memory cell is used for data storage. Each memory cell is a transistor, whose threshold voltage Vt depends on the content of the cell. Bank word line $BWL_N$ is used to select the Nth bank of the memory. Word lines $SWL_{N1} \sim SWL_{NM}$ are used to select one row of the memory cell array. Then, bit lines $SBL_N$ and $SBR_N$ are used to select a memory cell for reading.

FIG. 1B shows a diagram while reading the memory cell D. First, enable bank word lines $BWL_N$ and bit line $SBR_N$, then the current flows from bit line $BL_N$ to transistor M2, transistor D, transistor R5, transistor M3 and back to ground line $VG_{N+1}$. The current for reading a memory cell flows through four transistors in this case. And three selecting signals are needed.

The sources and drains of the memory cells are formed by diffusion layers. The sources/drains of the memory cells at the same column constitute a sub-bit line. A word line is formed by polysilicon, and the polysilicon also constitutes the gates of the memory cells. A memory cell with a ROM code has higher threshold voltage, and the ROM code is supplied depending on the content of the memory cell. There is no need of field oxide layer between memory cells and thus the layout is flat. The flat-type layout reduce the area of the memory. However, a field oxide layer is needed between the bank selection switches, such as M1 and M2. The manufacture process with an oxide layer costs more, and the area of the memory is larger.

SUMMARY OF THE INVENTION

It is therefore an object of the invention to provide an improved and simplified flat-cell nonvolatile semiconductor memory. The semiconductor memory includes a plurality of units. Each unit includes word lines, a main bit line, a ground line, sub-bit lines, memory cell columns, and bank-selecting switches. Word lines are disposed in parallel, and the main bit line and the ground line cross the word lines. Sub-bit lines are disposed substantially in parallel to the main bit lines. Each memory cell column includes a plurality of memory cells connected in parallel between respective adjacent two of the sub-bit lines. The bank-selecting switches are used to select one of the memory cell columns.

The first one of the bank-selecting switches is disposed between the main bit line and the fourth sub-bit line. The second of the bank-selecting switches is disposed between the main bit line and the second sub-bit line. The third of the bank-selecting switches is disposed between the ground line and the fifth sub-bit line. The fourth of the bank-selecting switches is disposed between the ground line and the third sub-bit line. The fifth of the bank-selecting switch is disposed between the ground line and the third sub-bit line. The sixth bank-selecting switch is disposed between the ground line and the first sub-bit line.

Wherein, the second, third, and fourth bank-selecting switches are controlled by a first selecting signal, and the first, fifth, and sixth bank-selecting switches are controlled by a second selecting signal.

Other objects, features, and advantages of the invention will become apparent from the following detailed description of the preferred but non-limiting embodiments. The following detailed description is made with reference to the accompanying drawings.

DESCRIPTION OF THE PREFERRED EMBODIMENT

Figure 1A:
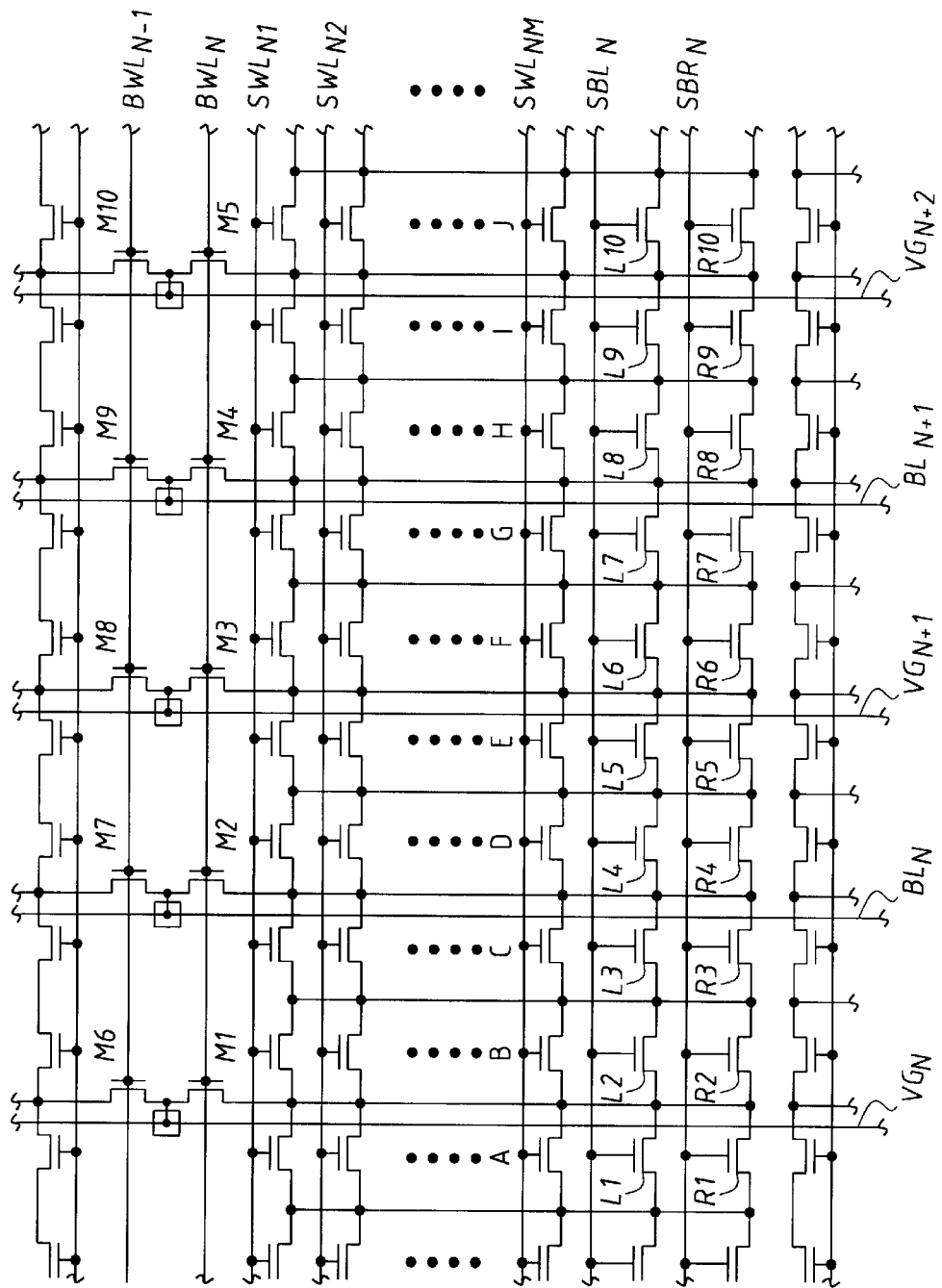
FIG. 1A is a circuit diagram of the Nth bank of the read only semiconductor memory from U.S. Pat. No. 5,117,389.
Figure 1B:
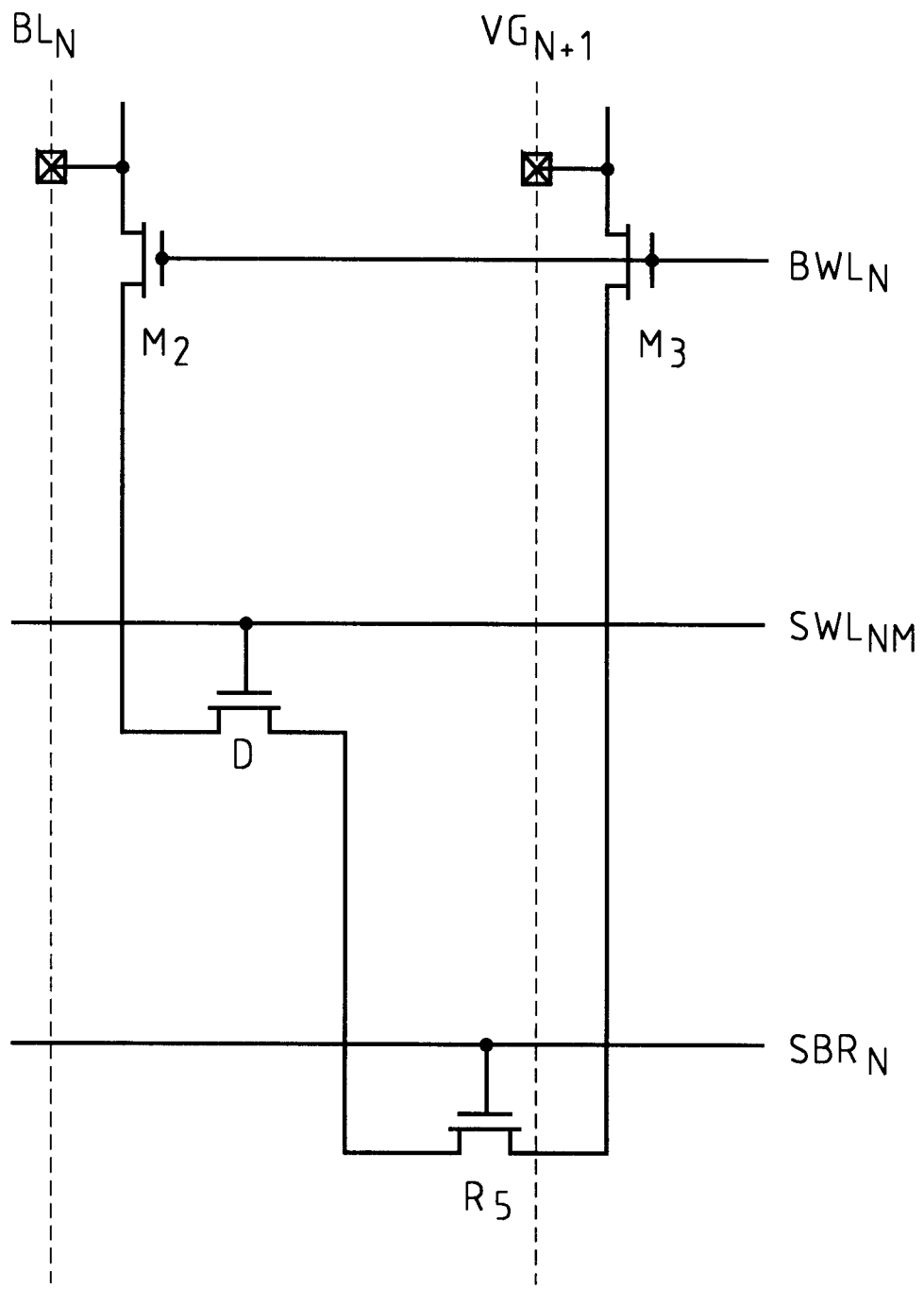
FIG. 1B is a diagram while reading the memory cell D.
Figure 2:
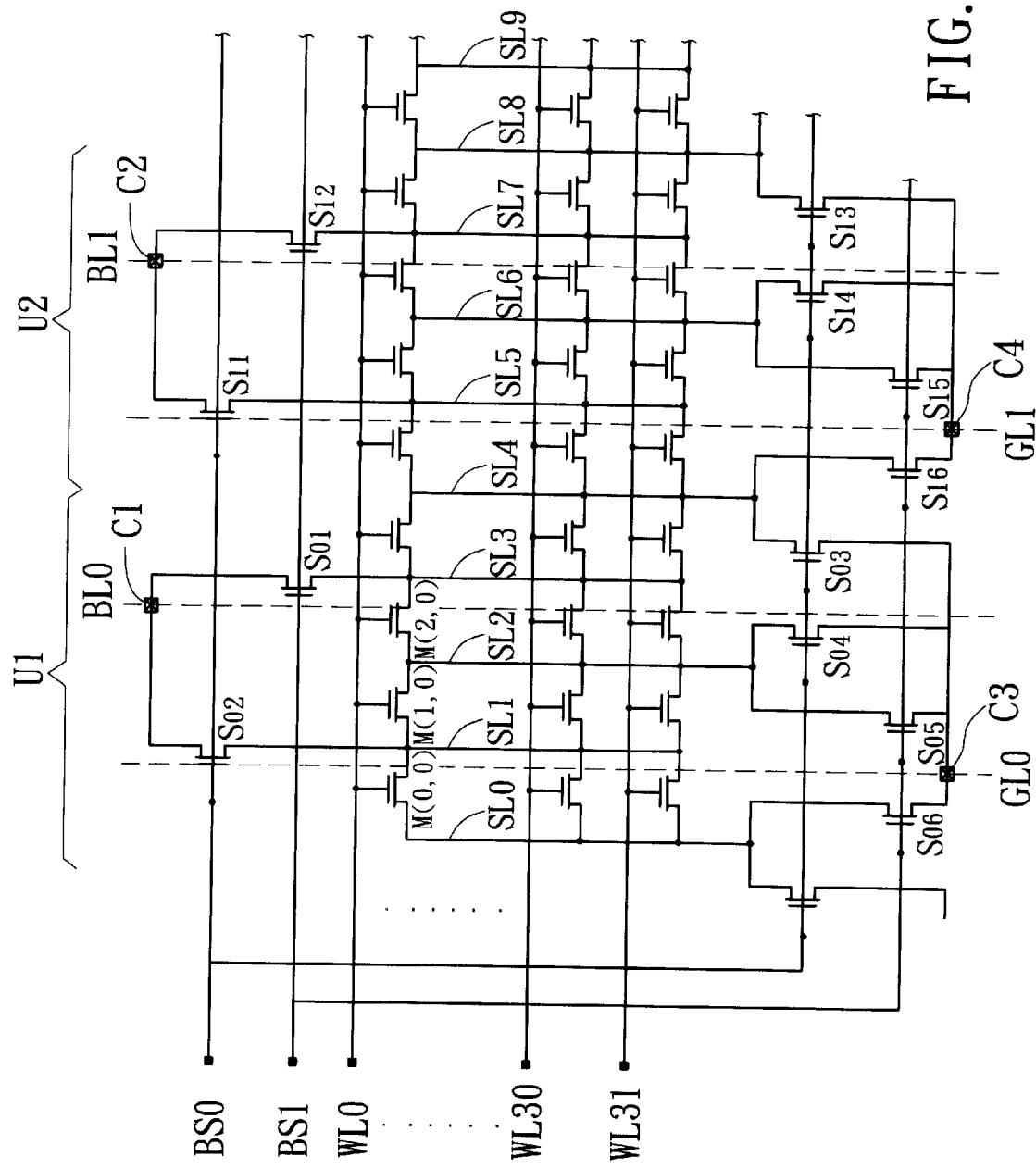
FIG. 2 is a first embodiment of a flat-cell nonvolatile semiconductor memory according to this invention.

Referring first to FIG. 2, which shows a preferred embodiment of a flat-cell nonvolatile semiconductor memory according to this invention. The semiconductor memory including a plurality of word lines WL, main bit lines BL, ground lines GL, sub-bit lines SL, memory cells M, and selection switches S. Word lines WL are disposed in parallel, and main bit lines BL and ground lines GL cross the word lines WL. A plurality of sub-bit lines SL are disposed substantially in parallel to the main bit lines BL. Each memory cell column includes a plurality of memory cells M connected in parallel between respective adjacent two of the sub-bit lines SL. The bank-selecting switches S are used to select one of the memory cell columns.

The bank-selecting switch $S_{01}$ is disposed between the main bit line BL0 and the sub-bit line SL3. The bank-selecting switch $S_{02}$ is disposed between the main bit line BL0 and sub-bit line SL1. The bank-selecting switch $S_{03}$ is disposed between the ground line GL0 and the sub-bit line SL4. The bank-selecting switch $S_{04}$ is disposed between the ground line GL0 and the sub-bit line SL2, The bank-selecting switch $S_{05}$ is disposed between the ground line GL0 and the sub-bit line SL2. The bank-selecting switch $S_{06}$ is disposed between the ground line GL0 and the sub-bit line SL0.

Wherein, the bank-selecting switches $S_{02}$, $S_{03}$, and $S_{04}$ are controlled by the selecting signal BS0, and the bank-selecting switches $S_{01}$, $S_{05}$, and $S_{06}$ are controlled by the selecting signal BS1.

Figure 3:
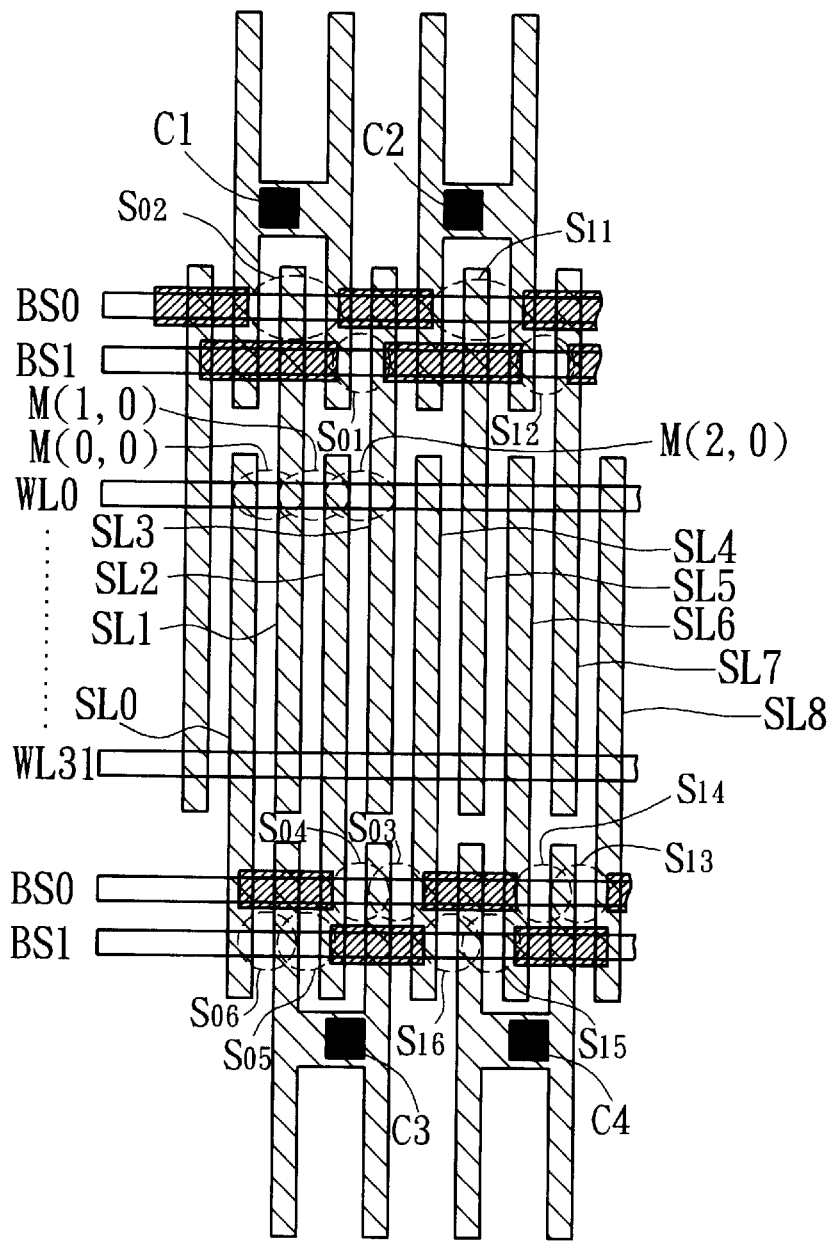
FIG. 3 is a layout diagram according to the circuit diagram in FIG. 2.

FIG. 3 shows a layout diagram according to the circuit in FIG. 2. The memory cells and bank-selecting switches are MOSFETs (Metal Oxide Semiconductor Field Effect Transistors). The sub-bit lines SL are each formed by a diffusion layer. The main bit lines BL and the ground lines GL are formed by metal. The field oxides are not needed between memory cells M and selecting switches S. Accordingly the semiconductor is essentially flat.

Figures 4, 5:
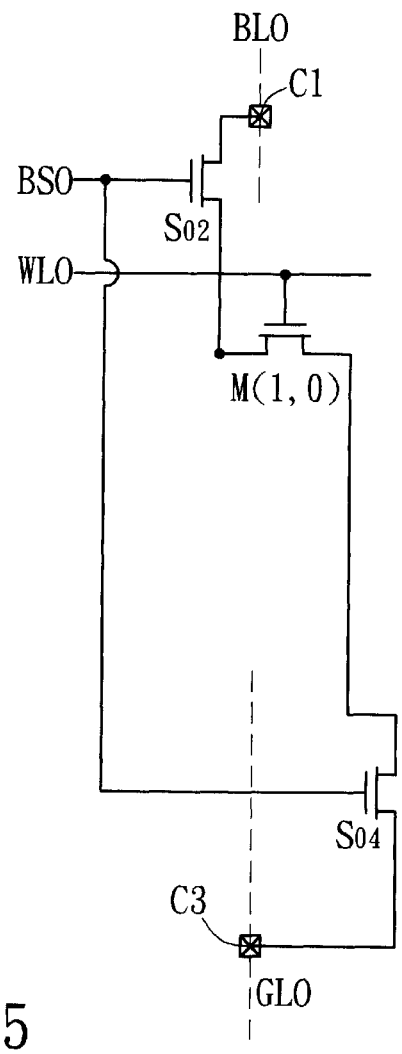
FIG. 4 is a control status table of the first embodiment.
FIG. 5 is a diagram for reading memory cell M(1,0)

FIG. 4 shows a control status table of the first embodiment. Please also refer to FIG. 5, which shows a diagram for a reading memory cell M(1,0). First, enable word line WL0, and enable the selecting signal BS0 so as to turn on the selecting switches $S_{02}$ and $S_{04}$. Then connect the ground line GL0 to ground so as to let the sensing current flows consecutively through main bit line BL0, selecting switch $S_{02}$, memory cell M(1,0), selecting switch $S_{04}$, and ground line GL0. If memory cell M(1,0) is turned on, the sense amplifier SA senses a current; if memory cell M(1,0) is turned off, the sense amplifier SA does not sense a current. Accordingly the data stored in memory cell M(1,0) depends on whether the sense amplifier SA senses the current.

The method for reading from the memory cell by this invention is simplified, because the invention needs only two selecting signals to determine the memory cell for reading, while the above-mentioned traditional method needs three selecting signals. A larger sensing current is also gained by this invention so as to enhance the reading performance, because the sensing current flows through fewer transistors.

Figure 6:
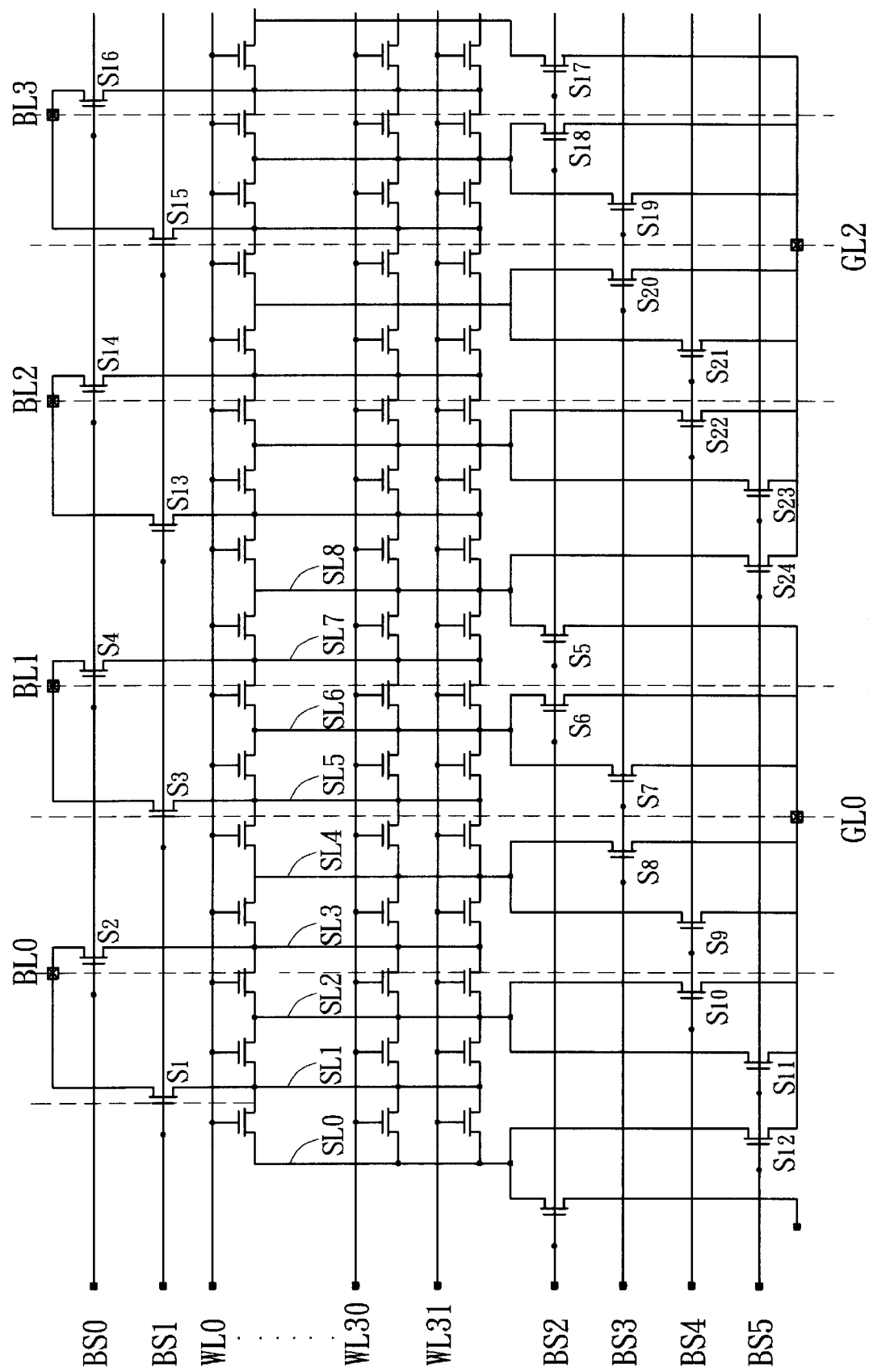
FIG. 6 is a second embodiment of the flat-cell nonvolatile semiconductor memory according to this invention.

FIG. 6 shows a second embodiment of the flat-cell nonvolatile semiconductor memory according to this invention. The memory has less ground lines than those of the first embodiment, i.e. one ground line corresponds to two main bit lines. The ground lines and the main bit lines are formed by metal. The metal lines cannot be too close so as to avoid signal interference. In order to make the semiconductor memory more compact, the memory in the second embodiment has fewer ground lines.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A flat-cell nonvolatile semiconductor memory including a plurality of word lines disposed in parallel, the semiconductor memory having a plurality of adjacent units, each of the plurality of units comprising:
   a main bit line which crosses the word lines;
   a ground line which crosses the word lines;
   a first sub-bit line, a second sub-bit line, a third sub-bit line, a fourth sub-bit line, and a fifth sub-bit line which are disposed substantially in parallel to the main bit line, each of the first, second, third, fourth and fifth sub-bit lines having a first end and a second end;
   four memory cell columns, each including a plurality of memory cells connected in parallel between respective adjacent two of the first, second, third, fourth and fifth sub-bit lines; and
   a plurality of bank-selecting switches for selecting one of the four memory cell columns;
   wherein, to the main bit line, the first ends of the second sub-bit line and the fourth sub-bit line are connected, and to the ground line, the second ends of the first sub-bit line, the third sub-bit line, and the fifth sub-bit line are connected;
   wherein the first one of the bank-selecting switches is disposed between the main bit line and the fourth sub-bit line, the second one of the bank-selecting switches is disposed between the main bit line and the second sub-bit line, the third one of the bank-selecting switches is disposed between the ground line and the fifth sub-bit line, the fourth one of the bank-selecting switches is disposed between the ground line and the third sub-bit line, the fifth one of the bank-selecting switches is disposed between the ground line and the third sub-bit line, the sixth one of the bank-selecting switches is disposed between the ground line and the first sub-bit line;
   wherein the second, third, and fourth ones of the bank-selecting switches are controlled by a first selecting signal, the first, fifth, and sixth ones of the bank-selecting switches are controlled by a second selecting signal;
   wherein the first sub-bit line is also a fifth sub-bit line of an immediately adjacent unit.

2. The semiconductor memory according to claim 1, wherein the plurality of memory cells and the plurality of bank-selecting switches are Metal Oxide Semiconductor Field Effect Transistors, MOSFETs.

3. The semiconductor memory according to claim 1, wherein the first sub-bit line, the second sub-bit line, the third sub-bit line, the fourth sub-bit line, and the fifth sub-bit line are each formed by a diffusion layer.

4. The semiconductor memory according to claim 1, wherein the main bit line and the ground line are formed by metal.

5. A flat-cell nonvolatile semiconductor memory including a plurality of word lines disposed in parallel, the semiconductor memory having a plurality of adjacent units, each of the plurality of units comprising:
   a first main bit line and a second main bit line which cross the word lines;
   a ground line which crosses the word lines;
   a first sub-bit line, a second sub-bit line, a third sub-bit line, a fourth sub-bit line, a fifth sub-bit line, a sixth sub-bit line, a seventh sub-bit line, an eighth sub-bit line, and a ninth sub-bit line, which are disposed substantially in parallel to the first main bit line and the second main bit line, each of the first, second, third, fourth, fifth, sixth, seventh, eighth, and ninth sub-bit lines having a first end and a second end;
   eight memory cell columns, each including a plurality of memory cells connected in parallel between respective adjacent two of the first, second, third, fourth, fifth, sixth, seventh, eighth, and ninth sub-bit line; and
   a plurality of bank-selecting switches for selecting one of the eight memory cell columns;
   wherein, to the first main bit line, the first ends of the second sub-bit line and the fourth sub-bit line are connected, and to the second main bit line, the first ends of the sixth sub-bit line and the eighth sub-bit line are connected, and to the ground line, the second ends of the first sub-bit line, the third sub-bit line, the fifth sub-bit line, the seventh sub-bit line, and the ninth sub-bit line are connected;
   wherein the first one of the bank-selecting switches is disposed between the first main bit line and the second sub-bit line, the second one of the bank-selecting switches is disposed between the first main bit line and the fourth sub-bit line, the third one of the bank-selecting switches is disposed between the second main bit line and the sixth sub-bit line, the fourth one of the bank-selecting switches is disposed between the second main bit line and the eighth sub-bit line, the fifth one of the bank-selecting switches is disposed between the ground line and the ninth sub-bit line, the sixth one of the bank-selecting switches is disposed between the ground line and the seventh sub-bit line, the seventh one of the bank-selecting switches is disposed between the ground line and the seventh sub-bit line, the eighth one of the bank-selecting switches is disposed between the ground line and the fifth sub-bit line, the ninth one of the bank-selecting switches is disposed between the ground line and the fifth sub-bit line, the tenth one of the bank-selecting switches is disposed between the ground line and the third sub-bit line, the eleventh one of the bank-selecting switches is disposed between the ground line and the third sub-bit line, the twelfth one of the bank-selecting switches is disposed between the ground line and the first sub-bit line;

wherein the second, and fourth ones of the bank-selecting switches are controlled by a first selecting signal, the first and third ones of the bank-selecting switches are controlled by a second selecting signal, the fifth and sixth ones of the bank-selecting switches are controlled by a third selecting signal, the seventh and eighth ones of the bank-selecting switches are controlled by a fourth selecting signal, the ninth and tenth ones of the bank-selecting switches are controlled by a fifth selecting signal, the eleventh and twelfth ones of the bank-selecting switches are controlled by a sixth selecting signal,;

wherein the first sub-bit line is also a ninth sub-bit line of an immediately adjacent unit.

6. The semiconductor memory according to claim 5, wherein the plurality of memory cells and the plurality of bank-selecting switches are Metal Oxide Semiconductor Field Effect Transistors, MOSFETs.

7. The semiconductor memory according to claim 5, wherein the first sub-bit line, the second sub-bit line, the third sub-bit line, the fourth sub-bit line, the fifth sub-bit line, the sixth sub-bit line, the seventh sub-bit line, the eighth sub-bit line, and the ninth sub-bit line are each formed by a diffusion layer.

8. The semiconductor memory according to claim 5, wherein the first and the second main bit line and the ground line are formed by metal.

* * * * *